United States Patent

Shimada et al.

[11] Patent Number: 5,866,969
[45] Date of Patent: Feb. 2, 1999

[54] ACTUATING CIRCUIT OF PIEZOELECTRIC TRANSFORMER AND ACTUATING METHOD THEREOF

[75] Inventors: Yasuhei Shimada; Nobuaki Honbo, both of Tokyo, Japan

[73] Assignee: NEC Corporation, Tokyo, Japan

[21] Appl. No.: 956,795

[22] Filed: Oct. 23, 1997

[30] Foreign Application Priority Data

Oct. 24, 1996  [JP]  Japan .................................. 8-282315

[51] Int. Cl.$^6$ .................................................. H01L 41/08
[52] U.S. Cl. ......................................................... 310/318
[58] Field of Search .................................. 363/131, 133, 363/134; 310/314, 316, 318, 319

[56] References Cited

U.S. PATENT DOCUMENTS

| 5,329,200 | 7/1994 | Zaitsu ........................ 310/316 |
| 5,654,605 | 8/1997 | Kawashima ................ 310/316 |
| 5,705,877 | 1/1998 | Shimada .................... 310/318 |

FOREIGN PATENT DOCUMENTS

| 8-33349 | 2/1996 | Japan . |
| 8-47265 | 2/1996 | Japan . |
| 8-27553 | 10/1996 | Japan . |

*Primary Examiner*—Matthew Nguyen
*Attorney, Agent, or Firm*—Sughrue, Mion, Zinn, Macpeak & Seas, PLLC

[57] ABSTRACT

An actuating circuit of a piezoelectric transformer which is small in thickness and size and has a wide input voltage range is developed. In the actuating circuit of the piezoelectric transformer, when a sine wave outputted from a AGC circuit is input to a delta-sigma modulator, the sine wave switches output driver and switches a second output driver through an invertor with a 1-bit quantized bit signal so as to generate a pulse signal having an amplitude of power supply voltage Vdd from the GND potential. Actuating waves output from the output drivers and are applied to 1 piezoelectric transformer extracting resonance frequency of a piezoelectric transformer through a filtering effect provided with an input capacitance of the piezoelectric transformer and coil converting the 1-bit quantized bit signal into a sine wave. Consequently, since the piezoelectric transformer can be operated with the sine wave, the piezoelectric transformer can be actuated efficiently.

12 Claims, 11 Drawing Sheets

PERIOD OF SINE WAVE

TIME →

ACTUATING CIRCUIT OF PIEZOELECTRIC TRANSFORMER AND ACTUATING METHOD THEREOF

BACKGROUND OF THE INVENTION

1. Field of the Invention

This invention relates to an actuation circuit of a piezoelectric transformer which converts a voltage of a dc voltage source into a predetermined voltage using a piezoelectric effect and an actuating method of a piezoelectric transformer.

2. Description of the Related Arts

A piezoelectric transformer is a voltage converting device wherein an ac voltage is applied to primary electrodes to generate mechanical oscillations through a piezoelectric effect so that to obtain a converted stable radio voltage from secondary electrodes, and is used for an invertor or a like device which generates a high voltage for a cold cathode fluorescent lamp.

Figure 1A:
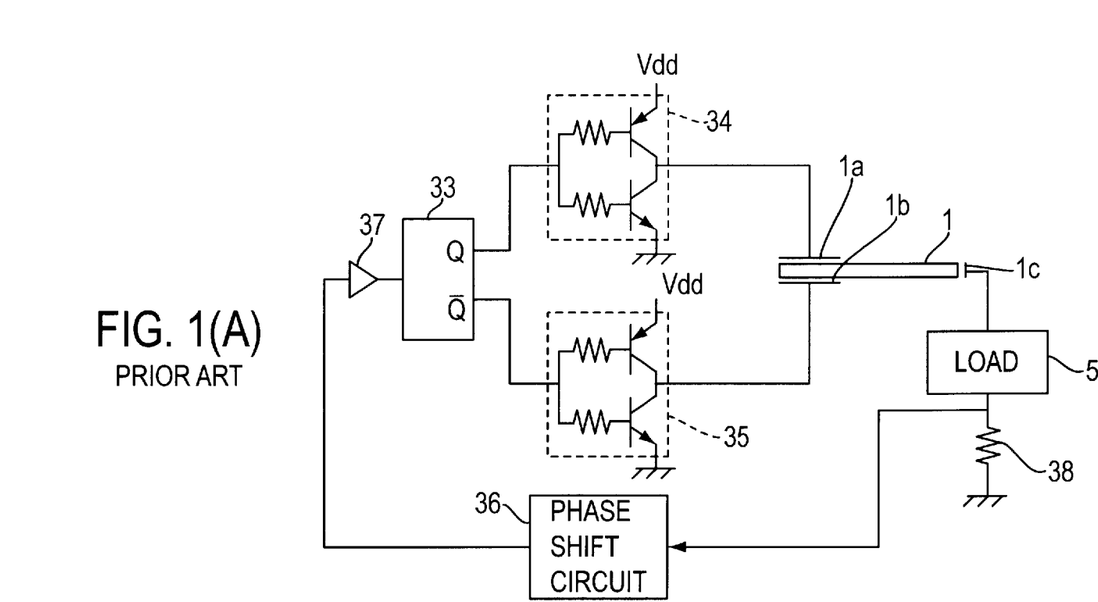
FIG. 1(A) is a block diagram of a conventional example 1 of an actuating circuit of a piezoelectric transformer.
Figure 1B:
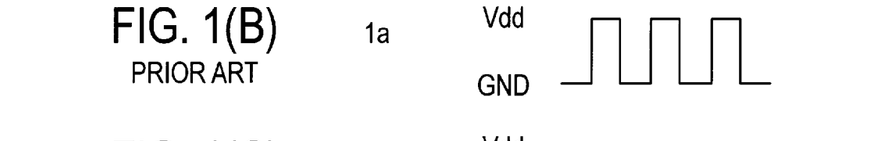
FIG. 1(B) is a waveform diagram of an input waveform to primary side electrode 1a, and FIG. 1(C) is a waveform diagram of an input waveform to the other primary side electrode 1b.
Figure 1C:
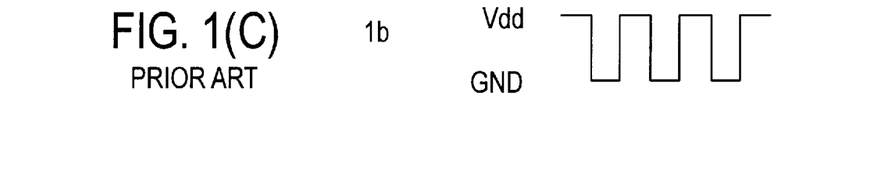

An actuating circuit of the piezoelectric transformer is disclosed in Japanese Patent Application Laid-Open No. 47265/1996 (hereinafter referred to as conventional example 1). As shown in FIG. 1, the piezoelectric transformer converts current flowing to load 5 connected to piezoelectric transformer 1 into a voltage using resistor 38. This signal is supplied to amplifier 37 through phase shifter circuit 36 to actuate flip-flop 33.

Two transistor switching circuits 34 and 35 are actuated by Q and $\overline{Q}$, output signals having opposite phase frequency divided by flip-flop 33 so that two pulse voltages of a resonance frequency of piezoelectric transformer 1 having phases different by 180 degrees from each other are generated from dc power supply voltage Vdd. The two pulse voltages are applied to primary side electrodes 1a and 1b of piezoelectric transformer 1 so that a voltage obtained by conversion by piezoelectric transformer 1 is extracted from secondary side electrode 1c. In other words, an conventional example 1 shown in FIG. 1, piezoelectric transformer 1 is actuated by a rectangular wave.

Figure 2A:
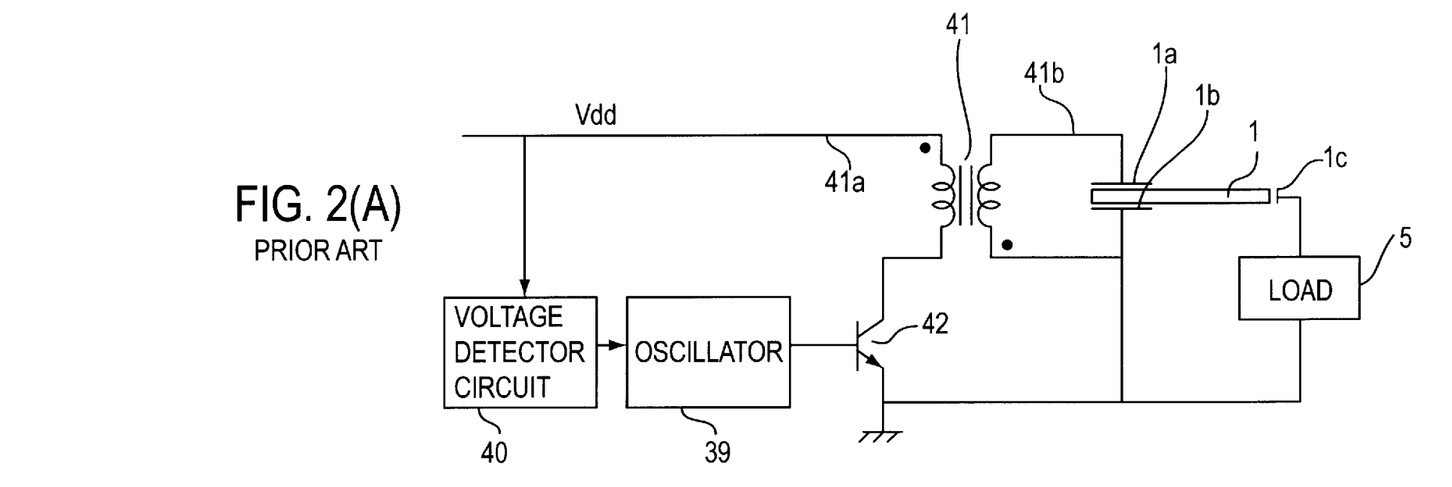
FIG. 2(A) is a block diagram of conventional example 2 of an actuating circuit of a piezoelectric transformer.
Figure 2B:
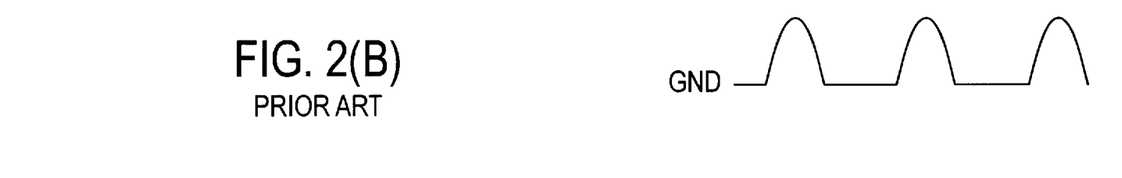

As another method of actuating piezoelectric transformer 1, the prior art of Japanese Patent Application Laid-Open No. 33349/1996 (hereinafter referred to as conventional example 2) is disclosed. According to the method, as shown in FIG. 2, electromagnetic transformer 41 is provided in a stage preceding to the input side of piezoelectric transformer 1, and a primary voltage of electromagnetic transformer 41 is detected by voltage detecting circuit 40 and switching transistor 42 is switched with a frequency corresponding to a value of the voltage. Thus, making use of resonance provided by the inductance on the secondary side of electromagnetic transformer 41 and an equivalent input capacitance of piezoelectric transformer 1, a half-sine wave having a voltage boosted from power supply voltage Vdd of FIG. 2 is generated.

Figure 12:
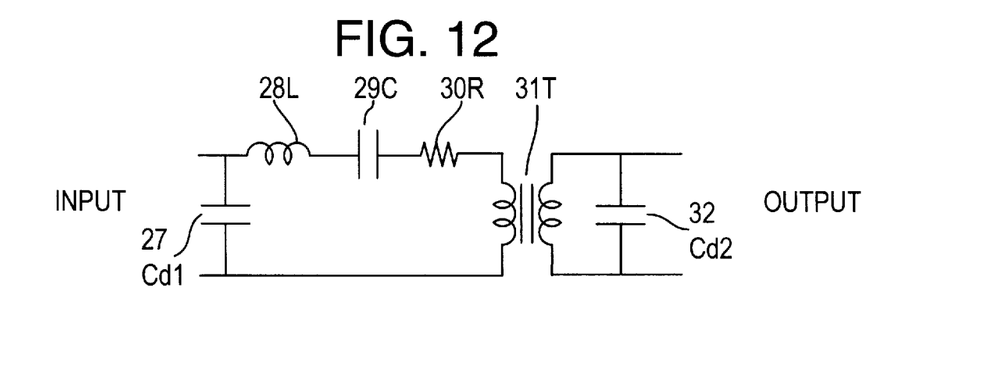
FIG. 12 is an equivalent circuit diagram of piezoelectric transformer 1.

An equivalent circuit of a piezoelectric transformer is generally represented as in FIG. 12 and is set such that it resonates with a resonance frequency of piezoelectric transformer 1 principally provided by equivalent input capacitance Cdl 27 and an inductance on the secondary side of electromagnetic transformer 41 in the preceding stage. The method described above is characterized in that piezoelectric transformer 1 is actuated with a half sine wave and a boosted voltage is outputted to load 5.

Figure 3A:
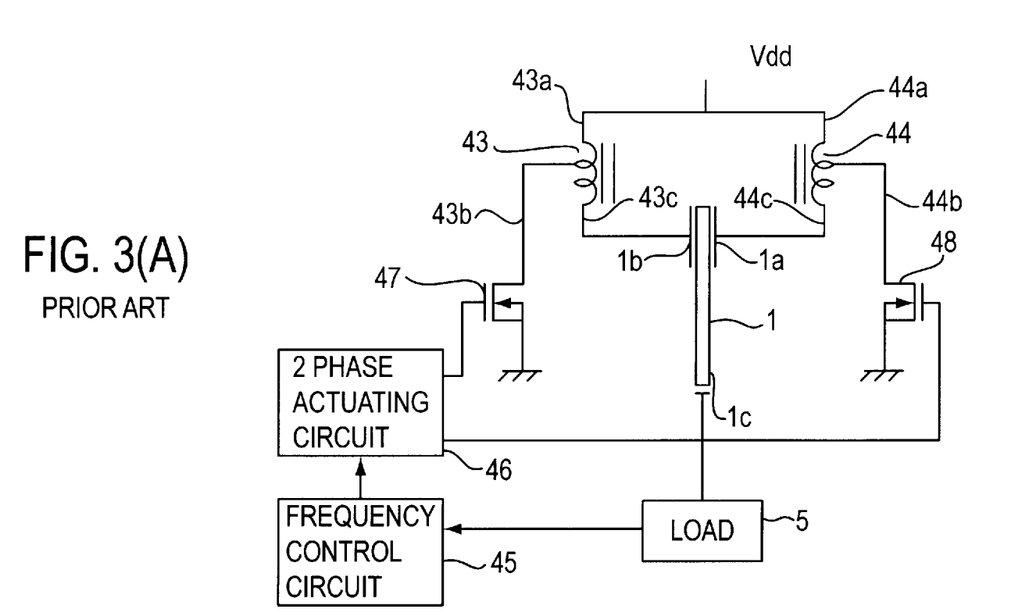
FIG. 3(A) is a block diagram of conventional example 3 of an actuating circuit of a piezoelectric transformer.

As additional prior art, a method wherein piezoelectric transformer 1 is actuated with a full-wave sine wave as in Japanese Patent Application Laid-open No. 27553/1996 (hereinafter referred to as conventional example 3) is disclosed. This actuating circuit is constructed, as shown in FIG. 3, the secondary sides of two autotransformers 43 and 44 are connected to two primary electrodes of piezoelectric transformer 1 while the primary sides of auto-transformers 43 and 44 are connected to power supply voltage Vdd. Further, switching transistors 47 and 48 are connected to centertaps of auto-transformers 43 and 44, and current flowing to load 5 is detected and an actuating frequency for frequency piezoelectric transformer 1 is determined based on the detected current by frequency control circuit 45 and inputted to 2-phase actuating circuit 46. Switching transistors 47 and 48 are alternately switched with the resonance frequency of piezoelectric transformer 1 in accordance with outputs of 2-phase actuating circuit 46.

Figure 3B:
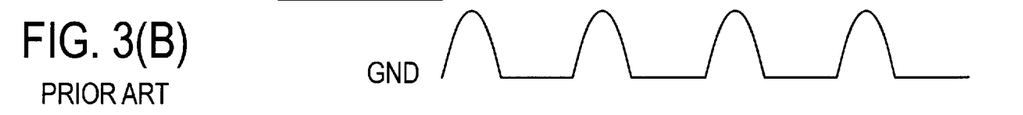
FIG. 3(B) is a waveform diagram of an input waveform to primary side electrode 1a and FIG. 3(C) is a waveform diagram of an input waveform to the other primary side electrode 1b.
Figure 3C:
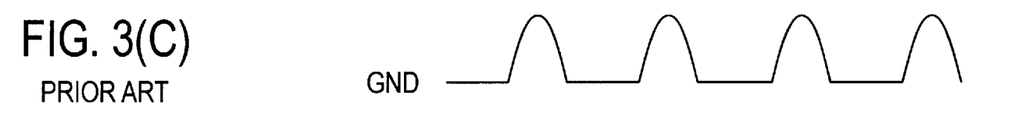

The actuating circuit of FIG. 3 is set such that a resonance circuit is formed from the inductances of the primary sides and the secondary sides of switching transistors 47 and 48 and principally equivalent input capacitance Cdl 27 of the equivalent circuit of piezoelectric transformer 1 shown in FIG. 12. Thus, half sine waves of two phases illustrated in FIG. 3(A) and 3(B) are generated, and the half sine waves of two phases are applied alternately to the two primary side electrodes of piezoelectric transformer 1. This corresponds to the fact that a sine wave is applied to the primary side electrodes of piezoelectric transformer 1. Piezoelectric transformer 1 can apply a boosted output voltage to load 5 in this manner.

As described above, as the methods of actuating piezoelectric transformer 1, three actuating methods such as the method of inputting the rectangular waves, the method of inputting the half sine waves and the method of inputting full sine waves are known in the prior art.

Figure 4A:
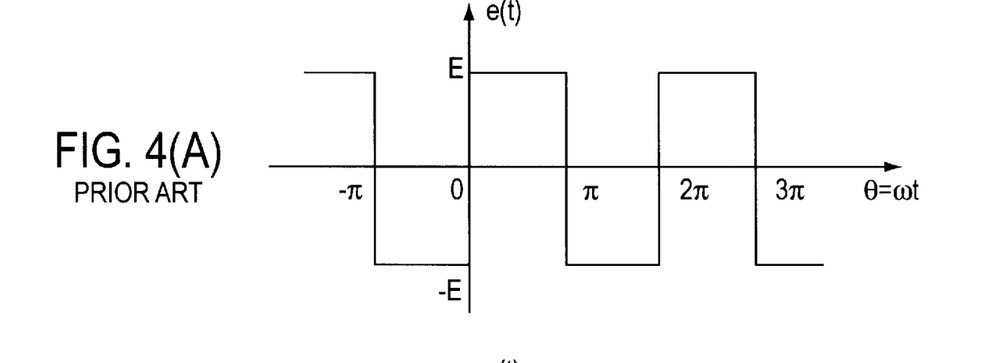
FIG. 4(A) is a waveform diagram of an input waveform to the piezoelectric transformer of conventional example 1 shown in FIG. 1.

The first problem resides in that, when a piezoelectric transformer is actuated with a waveform other than the sine waves such as the rectangular waves or a half sine wave, the actuating efficiency of piezoelectric transformer 1 is deteriorated. The reason is that, when the piezoelectric transformer is actuated, for example, with the rectangular waves as in Japanese Patent Application Laid-Open No. 47265/1996 (conventional example 1), since the rectangular wave includes harmonic components of the resonance frequency of the piezoelectric transformer, piezoelectric transformer 1 is oscillated also by the harmonic components. For example, if a rectangular wave of FIG. 4(A) is Fourier expanded to calculate a Fourier series f(t), it can be represented as expression (1):

$$f(t)=(4E)/\pi\{\sin\theta+(\tfrac{1}{3})\sin 3\theta+(\tfrac{1}{5})\sin\theta+$$
$$(\tfrac{1}{7})\sin 7\theta+\ldots\}. \tag{1}$$

Figure 4B:
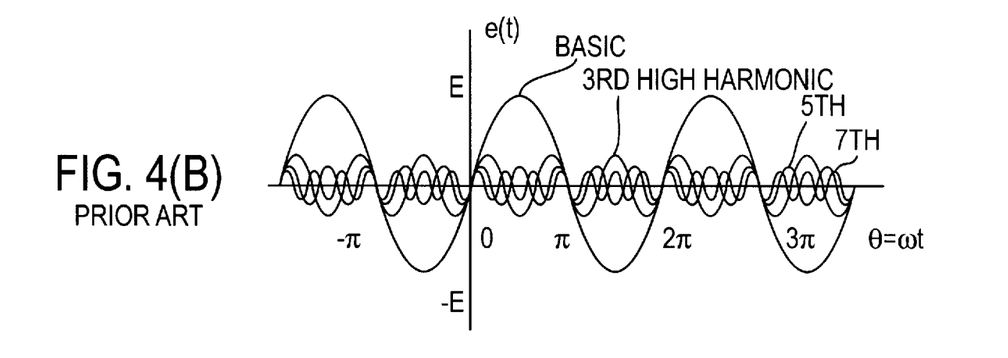
FIG. 4(B) is a waveform diagram of waveforms of a sine wave and harmonics obtained by analysis of a rectangular input wave to the piezoelectric transformer of conventional example 1 shown in FIG. 1.

From expression (1), it can be seen that the rectangular wave includes a sine wave of a fundamental frequency and additional sine waves of frequencies equal to odd-numbered times the fundamental frequency. By representing this expression (1) in a graph separately for the different frequency terms, a waveform diagram shown in FIG. 4(B) is obtained. Accordingly, when piezoelectric transformer 1 is actuated with the rectangular wave, also the sine waves having frequencies equal to odd-numbered times the resonance frequency are inputted to piezoelectric transformer 1, and piezoelectric transformer 1 is oscillated also with the harmonic components.

Figure 4C:
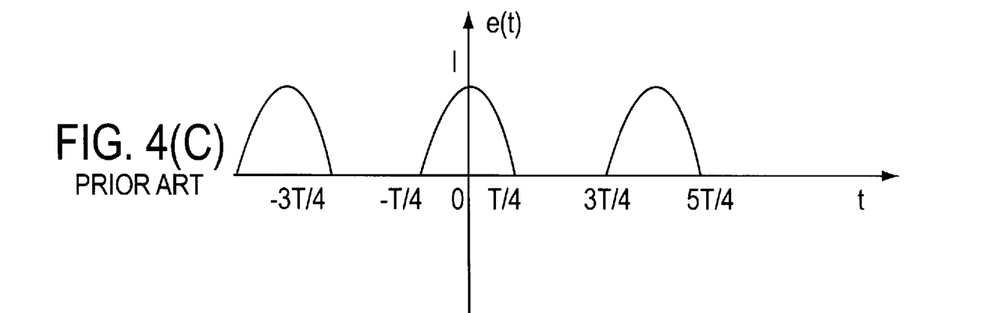
FIG. 4(C) is a waveform diagram of an input waveform to the piezoelectric transformer of conventional example 2 shown in FIG. 2.

Meanwhile, since energy of piezoelectric transformer 1 other than that of frequencies in the proximity of the resonance frequency cannot be extracted as output power, the oscillations of harmonic components of the resonance frequency become a loss. Accordingly, when the piezoelectric transformer is actuated using a rectangular wave, the efficiency is deteriorated. On the other hand, when the piezoelectric transformer is actuated with a half sine wave as in the conventional example 2, harmonic components of the resonance frequency are inputted to piezoelectric transformer 1 similarly. By calculating a Fourier series of a half sine wave shown in FIG. 4(C), it can be represented as expression (2):

$$f(t)=1/\pi+(\cos\theta)/2+(2/\pi\{((\frac{1}{3})\cos 2\theta-(\frac{1}{15})\cos 4\theta+\dots\}. \quad (2)$$

Also the expression (2) includes harmonic components, and it is apparent that the actuating efficiency is deteriorated compared with that where a full sine wave is used. From the foregoing explanation, in order to efficiently actuate piezoelectric transformer 1, it is desirable to use a full sine wave.

The second problem resides in that, when half sine waves of two phases are generated in order to achieve efficient actuation as in the actuating circuit of the conventional example 3, two electromagnetic transformers are required, resulting in drawbacks that a high cost is required and that also the invertor has an increased physical size.

The reason is that, if piezoelectric transformer 1 is actuated with a sine wave without making use of a fly-back voltage of an electromagnetic transformer or a coil, power loss occurs in the actuating circuit. Where piezoelectric transformer 1 is actuated with a sine wave without using a fly-back voltage, an amplifier of the class A must be used as an actuating stage. However, when an intermediate voltage between a power supply voltage and the GND potential like a sine wave is outputted, a voltage corresponding to a difference between the power supply voltage and the voltage applied to piezoelectric transformer 1 is applied to the output transistor, and power equal to the product of the voltage and current flowing out from the output transistor is consumed by the transistor.

Since this power becomes a loss of the actuating circuit, where a piezoelectric transistor is actuated with a sine wave using an amplifier of the class A, the actuating circuit exhibits a loss, resulting in a problem that the efficiency of the entire invertor is deteriorated. Since half sine waves of two phases must be produced using two electromagnetic transformers, a high cost and a large physical size are required.

The third problem is that the input voltage range of the piezoelectric transformer actuating circuit is narrow. The reason is that the actuating voltage inputted to piezoelectric transformer 1 is, in the conventional example 1, a rectangular wave having an amplitude equal to twice that of power supply voltage Vdd from the GND potential, and also the actuating voltage of piezoelectric transformer 1 increases in proportion to the power supply voltage. Also in the conventional example 2 or 3, since a power supply voltage is applied to the primary side of an electromagnetic transformer so that a fly-back voltage is produced on the primary side and a boosted voltage is extracted from the secondary side of the electromagnetic transformer to actuate piezoelectric transformer 1, the actuating voltage of piezoelectric transformer 1 increases in proportion to power supply voltage Vdd. Therefore, the three conventional examples 1 to 3 actuate to feed a fixed output current and voltage to load 5 by varying a boosting ratio raising the actuating frequency of piezoelectric transformer 1.

Generally, since piezoelectric transformer 1 operates in the highest efficiency with the resonance frequency thereof and the efficiency drops as the frequency thereto is displaced away from the resonance frequency, there is a limitation to absorb the variation of the power supply voltage. For example, if the power supply voltage increases to twice, then piezoelectric transformer 1 must be operated with a half boosting ratio. Therefore, where the equivalent input capacitance of piezoelectric transformer 1 and the inductance of the electromagnetic transformer are set so as to cause resonance, as in conventional example 2 or example 3, since the actuating waveform does not vary, the switching period can be varied but in a very small range. Consequently, it is generally difficult to obtain a twice or more input voltage range.

Further, as the power supply voltage rises, the loss of the actuating circuit increases. Where the power supply voltage is represented by Vdd, the primary side inductance of the electromagnetic transformer is represented by L1 and the time during when the switching transistor is on is represented by t, current Id flowing to the primary side of the electromagnetic transformer and the switching transistor is represented by expression (3):

$$Id=Vdd\times t/L1 \quad (3)$$

Accordingly, from expression (3), the current flowing to the electromagnetic transformer and the switching transistor increases in proportion to the power supply voltage, and as the power supply voltage of the piezoelectric transformer actuating circuit increases, the current flowing to the electromagnetic transformer and the switching transistor increases in proportion to the power supply voltage. However, since the output voltage of piezoelectric transformer 1 is controlled to a fixed level, surplus power inputted to the electromagnetic transformer is returned to the power supply side. Consequently, the loss by a series resistance component of the electromagnetic transformer and the switching transistor increases, and also the efficiency of the piezoelectric transformer actuating circuit is deteriorated. As described above, the conventional examples have a drawback that the input voltage range is narrow.

SUMMARY OF THE INVENTION

It is an object of the present invention to provide an actuating circuit of a piezoelectric transformer which, solving the problems described above, is high in efficiency even where a single or no electromagnetic transformer or coil is used, and is small in thickness and size and besides has a wide voltage range, and an actuating method of the actuating circuit.

In order to attain the object described above, according to an actuating method of a piezoelectric transformer of the present invention, a resonance frequency is determined as a first frequency, and a 1-bit quantized bit signal obtained by oversampling a sine wave having a frequency in the proximity of the first frequency with a second frequency, which is higher than twice the first frequency, is inputted as an actuating signal to the primary terminals of the piezoelectric transformer while a voltage obtained by conversion is outputted to a secondary terminal of the piezoelectric transformer.

Preferably, a voltage amplitude shown in the 1-bit quantized bit signal is used as a voltage of a dc power supply, or, even if the dc voltage value varies, a voltage component of the first frequency included in the 1-bit quantized bit signal inputted to the primary terminals is fixed. The actuating signal to be inputted to the primary terminals may be inputted through a band-pass filter or a low-pass filter which passes the first frequency. Further, in a preferred from, actuating signals having phases opposite to each other are inputted to both sides of the primary terminals.

Meanwhile, an actuating circuit of a piezoelectric transformer of the present invention includes current to voltage converting circuit 6 so that current to flow to load 5 may be fixed, frequency sweeping oscillating circuit 8 for generating a sine wave having a frequency a little higher than a resonance frequency of the piezoelectric transformer, means controlling the boosting ratio of the piezoelectric transformer to determine an actuating frequency of the piezoelectric transformer, and delta-sigma modulator 2 serving as 1-bit quantized bit signal generating means for converting a value of each amplitude obtained by oversampling the sine wave of the actuating frequency into a 1-bit quantized bit signal, the 1-bit quantized bit signal being used to switch output drivers 3 and 4 to actuate the piezoelectric transformer. The actuating circuit further comprises coil 11 as means for removing harmonic components of the resonance frequency of the piezoelectric transformer included in the 1-bit quantized bit signal inputted to the piezoelectric transformer. The actuating circuit further comprises actuating voltage control means AGC 9 for keeping the actuating signal to be applied to the piezoelectric transformer fixed even if the power supply voltage varies.

Other and further objects of this invention will become obvious upon understanding the illustrative embodiments described or indicated in the appended claims, and various advantages not referred to herein will occur to one skilled in the art upon employment of the invention in practice.

BRIEF DESCRIPTION OF THE DRAWINGS

FIG. 2(B) is a waveform diagram of an input waveform to primary side electrode 1a;

FIG. 9(B) is a waveform diagram illustrating an output signal of delta-sigma modulator 2 shown in FIG. 8(A), FIG. 9(A') is a partial enlarged view of the waveform diagram of FIG. 9(B), FIG. 9(A) is a waveform diagram illustrating a clock signal to the delta-sigma modulator;

DESCRIPTION OF THE PREFERRED EMBODIMENTS

Figure 5:
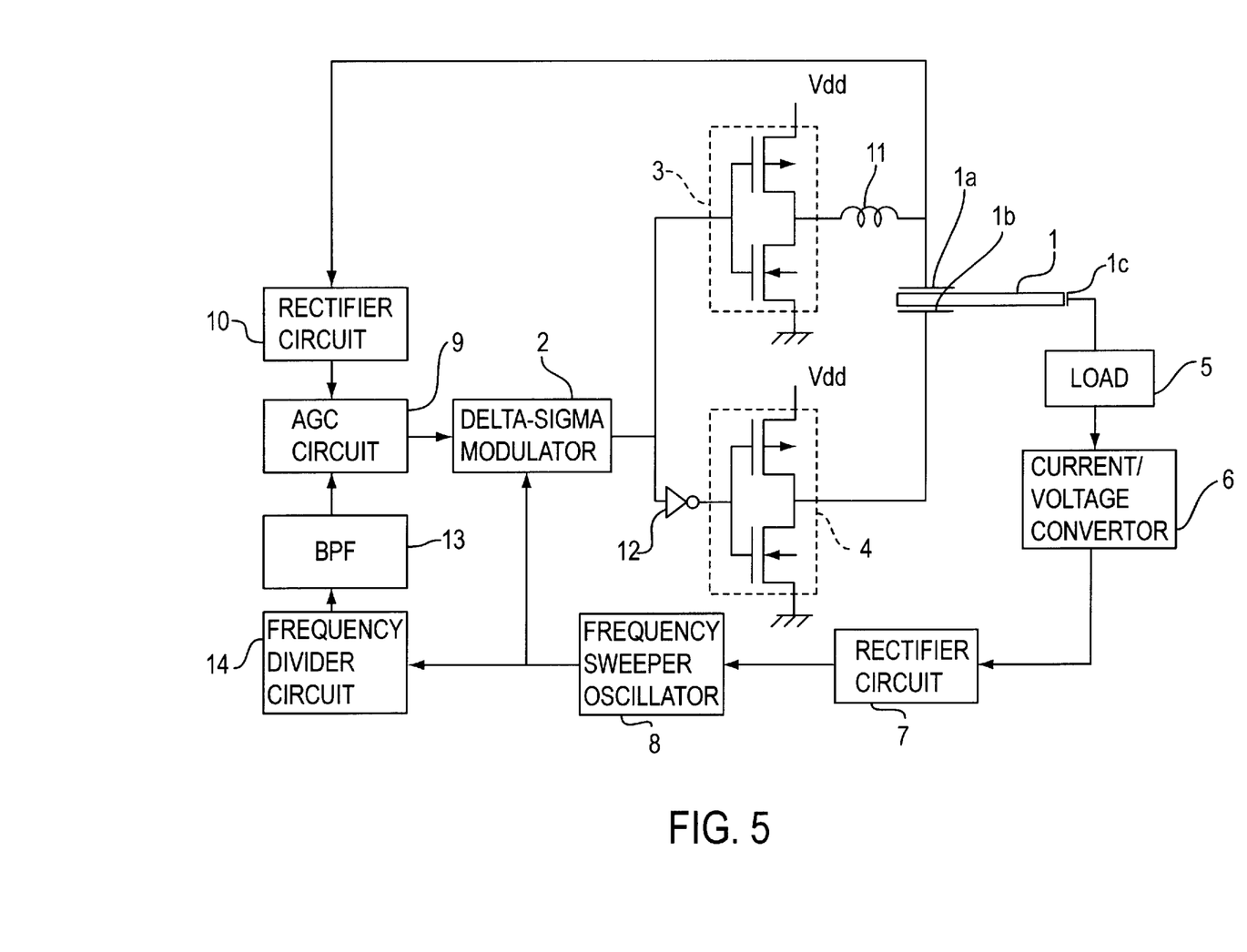
FIG. 5 is a block diagram of a first embodiment of an actuating circuit of a piezoelectric transformer according to the present invention.
Figure 8A:
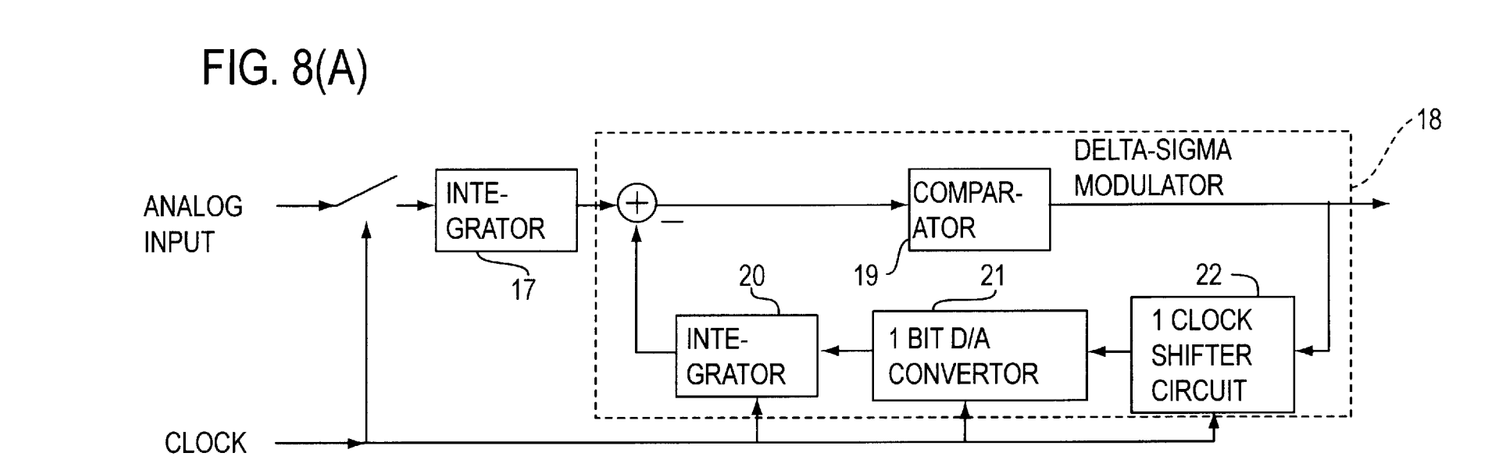
FIG. 8(A) is a detailed block diagram of a delta-sigma modulator shown in FIG. 5.

FIG. 5 is a block diagram of a first embodiment of the present invention, which is formed as an invertor for inputting a fixed ac voltage to load 5. Meanwhile, FIG. 8 is a detailed block diagram of delta-sigma modulator 2 which is used as a 1-bit A/D converter shown in FIG. 5. The actuating circuit of a piezoelectric transformer shown in FIG. 5 includes piezoelectric transformer 1, delta-sigma modulator 2, output drivers 3 and 4, load 5, current to voltage converting circuit 6, rectifier circuit 7, frequency sweeping oscillator 8, AGC circuit 9, rectifier circuit 10, coil 11 serving as a filter for extracting a resonance frequency of piezoelectric transformer 1, invertor 12, band-pass filter (BPF) 13, and frequency divider circuit 14.

The piezoelectric transformer actuating circuit shown in FIG. 5 employs delta-sigma modulator 2 as a circuit which generates a sine wave based on a sine wave signal in the form of 1-bit quantized bit signal.

Basic operation of the delta-sigma modulator is described with reference to FIG. 8. Delta-sigma modulator 18 requires integrator 17 at the input stage thereof, and includes, in a modulator thereof, integrator 20, comparator 19, 1-clock delay circuit 22 and D/A converter 21.

An analog signal input to delta-sigma modulator 18 passes through a switch, which operates in synchronism with a clock signal, and is inputted to integrator 17, by which it is integrated. Then, waveform alpha in FIG. 8(B) from integrator 17 and a waveform beta in FIG. 8(B) which is an output signal of integrator 20 are compared with each other.

Figure 8B:
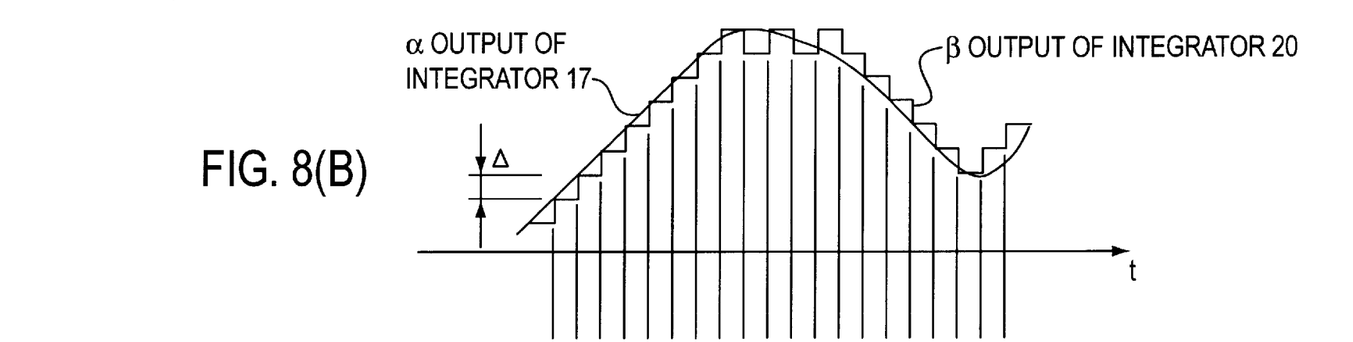
FIG. 8(B) is a waveform diagram illustrating an output signal of integrator 17 and an output signal of integrator 20 and FIG. 8(C) is a waveform diagram illustrating a digital output of the delta-sigma modulator.
Figure 8C:
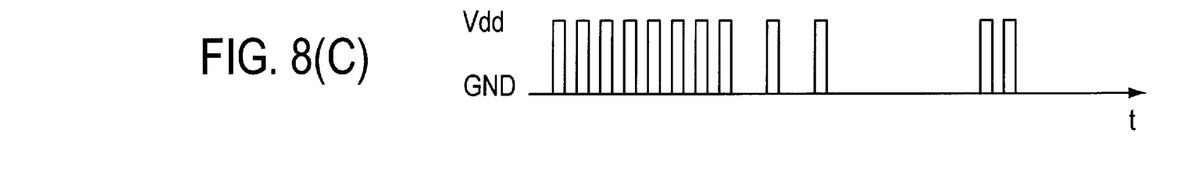

When the output of integrator 20 is higher, the delta-sigma modulator outputs a high level and feeds back a control signal for increasing the voltage of integrator 20 by one step A (delta) as seen in FIG. 8(B). When the output of integrator 20 is lower, the delta-sigma modulator outputs a low level and feeds back another control signal for decreasing the output voltage of integrator 20 by one step A. By this operation, delta-sigma modulator 2 outputs a level which becomes higher as the positive inclination of the input signal increases but becomes lower as the negative inclination of the input signal increases. Accordingly, when a sine wave is inputted to delta-sigma modulator 2, such an output waveform as shown in FIG. 9(B) is obtained.

Figures 9A, 9B:
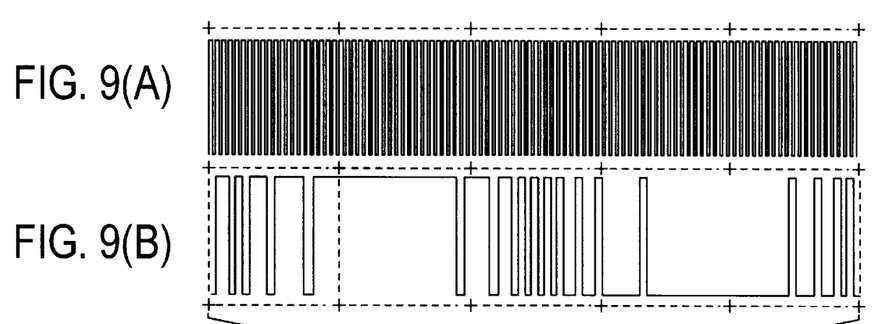

Referring to FIG. 5, when the output voltage of a sine wave from AGC circuit 9 is inputted to delta-sigma modulator 2, such a 1-bit quantized bit signal as seen in FIG. 9(B) is outputted from delta-sigma modulator 2. This 1-bit quantized bit signal is input to output driver 3 and input to output driver 4 through invertor 12. The outputs of output drivers 3 and 4 exhibit pulse-like waveforms having the amplitude of power supply voltage Vdd from the GND potential. Further, since the output of delta-sigma modulator 2 is inputted to output driver 4 through invertor 12, a voltage waveform having a phase reverse to that of output driver 3 is outputted from output driver 4.

Figure 9C:
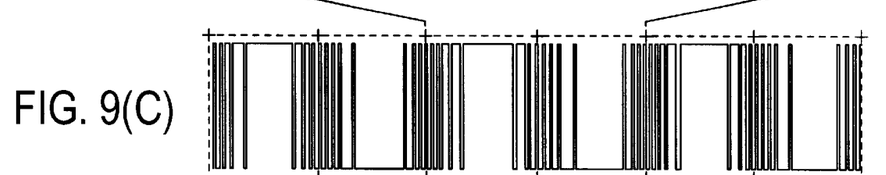
FIG. 9(C) is a waveform diagram illustrating a sine wave input waveform to the piezoelectric transformer.
Figure 9D:
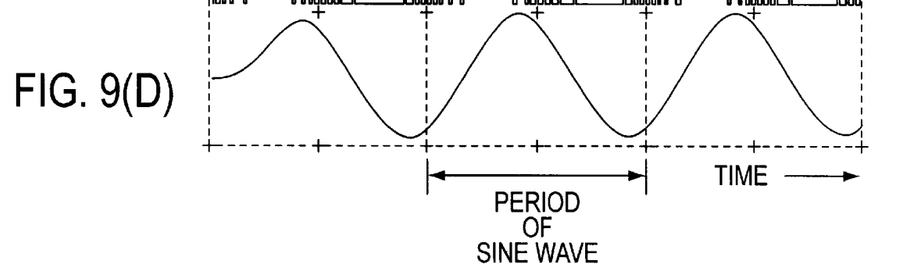

Actuating waveforms output from output drivers 3 and 4 are applied to a filter formed from a combination of the input capacitance of piezoelectric transformer 1 and coil 11, which have been set so as to extract a resonance frequency of piezoelectric transformer 1, to remove harmonic components of the actuating waveforms. Consequently, a 1-bit quantized bit signal can be converted into such a sine wave as shown in FIG. 9(C). Thus, since the piezoelectric transformer can be operated with the sine wave, piezoelectric transformer 1 can be actuated efficiently. In this instance, current by harmonic components of the actuating signals does not flow because coil 11 and piezoelectric transformer 1 exhibit a high impedance state. Therefore, energy of the harmonic components does not become a loss. Besides, since the output drivers perform a mere on/off operation, such loss as occurs with an amplifier of the class A does not occur.

The input voltage to piezoelectric transformer 1 of FIG. 5 is converted into dc current by rectifier circuit 10 and inputted to AGC circuit 9. AGC circuit 9 is constructed such that, as the rectified dc voltage increases, the amplitude of the voltage to be outputted to delta-sigma modulator 2 is decreased. Also when power supply voltage Vdd to be inputted to the actuating circuit varies, the actuating voltage of piezoelectric transformer 1 is controlled so as to be fixed. Therefore, a fixed output can be obtained even if the boosting ratio of piezoelectric transformer 1 is varied.

Further, the reason why the output of the AGC circuit is decreased is that, if a sine wave of a small amplitude is inputted to delta-sigma modulator 2, then the amplitude of the sine wave for actuating piezoelectric transformer 1 can be fixed because delta-sigma modulator 2 operates so as to decrease the output time of a high level or a low level of the 1-bit quantized bit signal to be outputted. Since the input voltage of piezoelectric transformer 1 can be kept fixed as described above, the actuating circuit and piezoelectric transformer 1 can be actuated efficiently over a wide power supply voltage.

A method of controlling the actuating frequency of piezoelectric transformer 1 in the circuit of FIG. 5 is described below. Current to voltage converting circuit 6 is provided on the lower voltage side of load 5 of FIG. 5, and the actuating frequency of piezoelectric transformer 1 is controlled by frequency sweeping oscillator 8 so that the current to flow to load 5 may be fixed. An internal construction of frequency sweeping oscillator 8 is shown in a block diagram of FIG. 10.

After ac current flowing to load 5 is converted into a voltage by current to voltage converting circuit 6, it is converted into a dc voltage by rectifier circuit 7. The signal inputted from rectifier circuit 7 and reference voltage $V_{ref2}$ are compared with each other by comparator 23, and when the input voltage is lower, comparator 23 outputs a signal of a high level. This signal is inputted to integrator 24. Integrator 24 is constructed such that the output voltage thereof drops at a fixed rate during a period within which a signal of a high level is inputted thereto. The output voltage of integrator 24 is inputted to VCO 25. VCO 25 is a voltage controlled oscillator which oscillates a frequency which increases in proportion to the input voltage, and oscillates a clock signal having a frequency equal to an integral number of times the actuating frequency of piezoelectric transformer 1.

Figure 10:
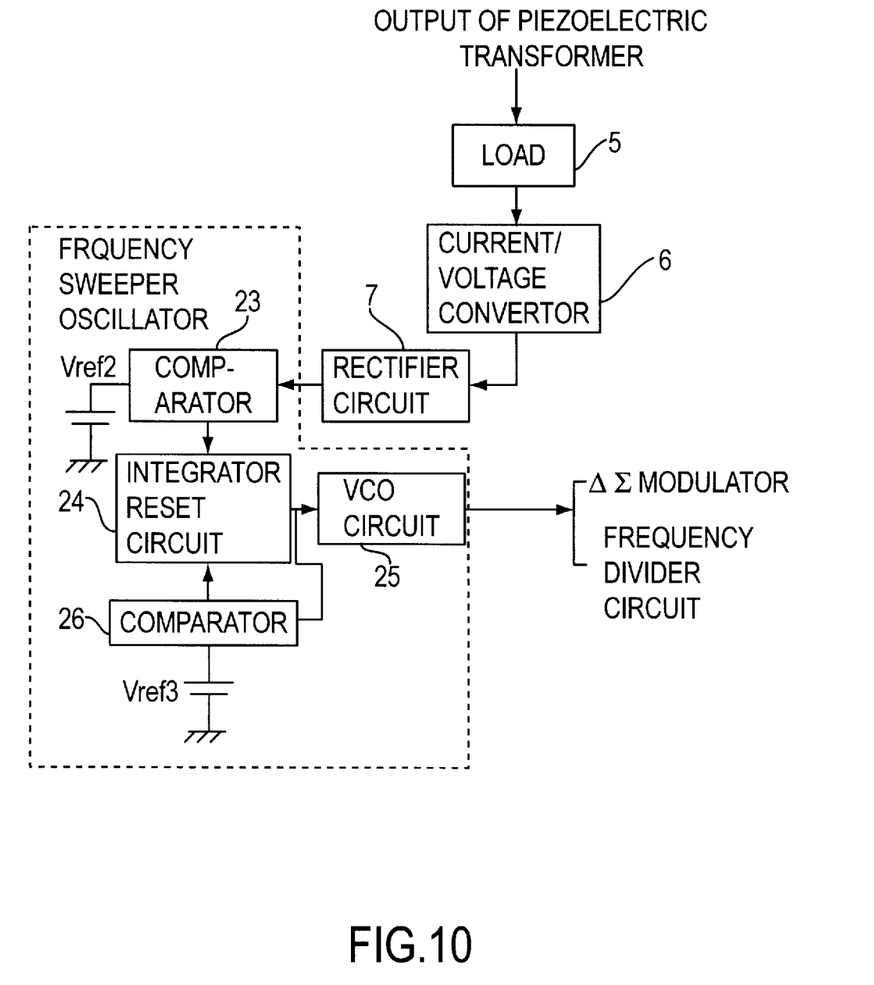
FIG. 10 is a detailed block diagram of a frequency sweeping oscillating circuit shown in FIG. 5.
Figure 11:
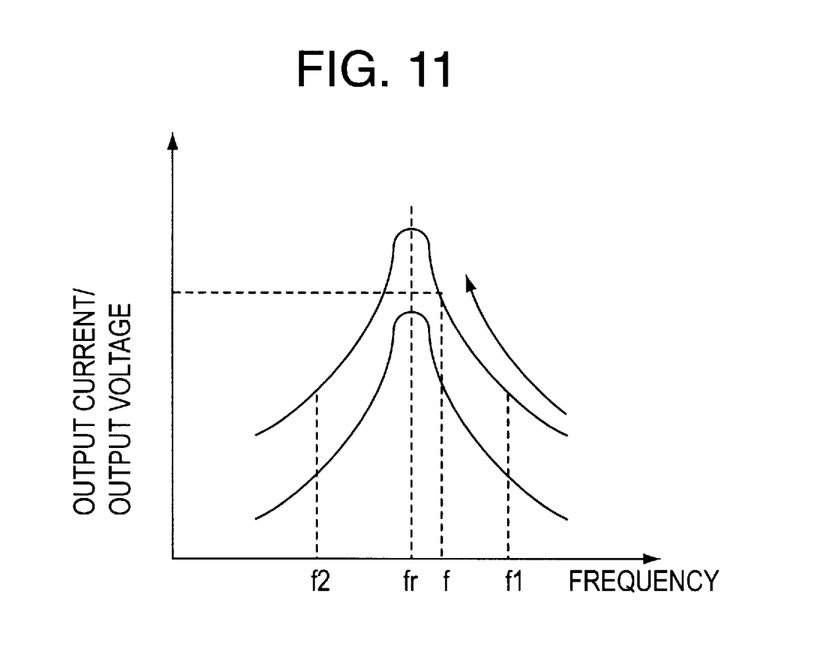
FIG. 11 is a diagram illustrating operation of frequency sweeping oscillator 8 shown in FIG. 10.

Sampling of delta-sigma modulator 2 of FIG. 5 is performed with the clock signal, and simultaneously, the clock signal is divided to a frequency equal to the frequency thereof divided by an integral number by frequency divider circuit 14. The divided signal is inputted to band-pass filter (BPF) 13, by which it is converted into a sine wave having a frequency in the proximity of the resonance frequency of piezoelectric transformer 1. After the amplitude of the sine wave is controlled through AGC circuit 9, the sine wave is converted into a 1-bit quantized bit signal by delta-sigma modulator 2 to actuate piezoelectric transformer 1.

Where the current flowing through load 5 is lower than a prescribed output value, the frequency of VCO 25 of FIG. 10 continues to drop. As the frequency of VCO 25 continues to drop, it approaches resonance frequency fr of piezoelectric transformer 1 since also the actuating frequency of piezoelectric transformer 1 is set in a direction to drop from f1 as seen from FIG. 9. Accordingly, since the boosting ratio of piezoelectric transformer 1 increases, the current to flow through load 5 increases. If a voltage value obtained by current to voltage conversion of the current value of load 5 becomes higher than reference voltage $V_{ref2}$ of comparator 23 of FIG. 10 and the output of comparator 23 changes to a low level, then the output signal of integrator 24 thereafter remains keeping the voltage equal to that immediately prior to the change to the low level. By this operation, the output frequency of VCO 25 becomes fixed, and piezoelectric transformer 1 is actuated with the fixed frequency.

When power supply voltage Vdd inputted to the invertor of FIG. 5 is low or, even if the power supply to the invertor is connected, as in a case wherein load 5 is a cold cathode fluorescent lamp, tube current does not flow until load 5 is lit, the output of comparator 26 of FIG. 10 remains a high level, and the actuating frequency continues to drop. When the actuating frequency reaches frequency f2, it becomes lower than reference voltage $V_{ref3}$ at comparator 26 to which the output of integrator 24 is inputted. Consequently, comparator 26 outputs a high level output signal to reset integrator 24. In response to the reset signal, the output of integrator 24 exhibits its highest voltage, and integrator 24 outputs the frequency of f1. Consequently, the sequence of operations described above is repeated. Thus, if power supply voltage Vdd restores its sufficient voltage or a cold cathode fluorescent lamp discharges to allow load current to flow, then an operation of locking the actuating frequency at actuating frequency f with which current of the prescribed output value is obtained. By such control as described above, when the power supply voltage is sufficiently high, it is possible to cause fixed current to always flow to the load. While the foregoing description relates to a case wherein the current to flow to the load is controlled to a fixed value, generically, in order to keep the output voltage of piezoelectric transformer 1 fixed, the output voltage has to be inputted directly to rectifier circuit 7.

Figure 6:
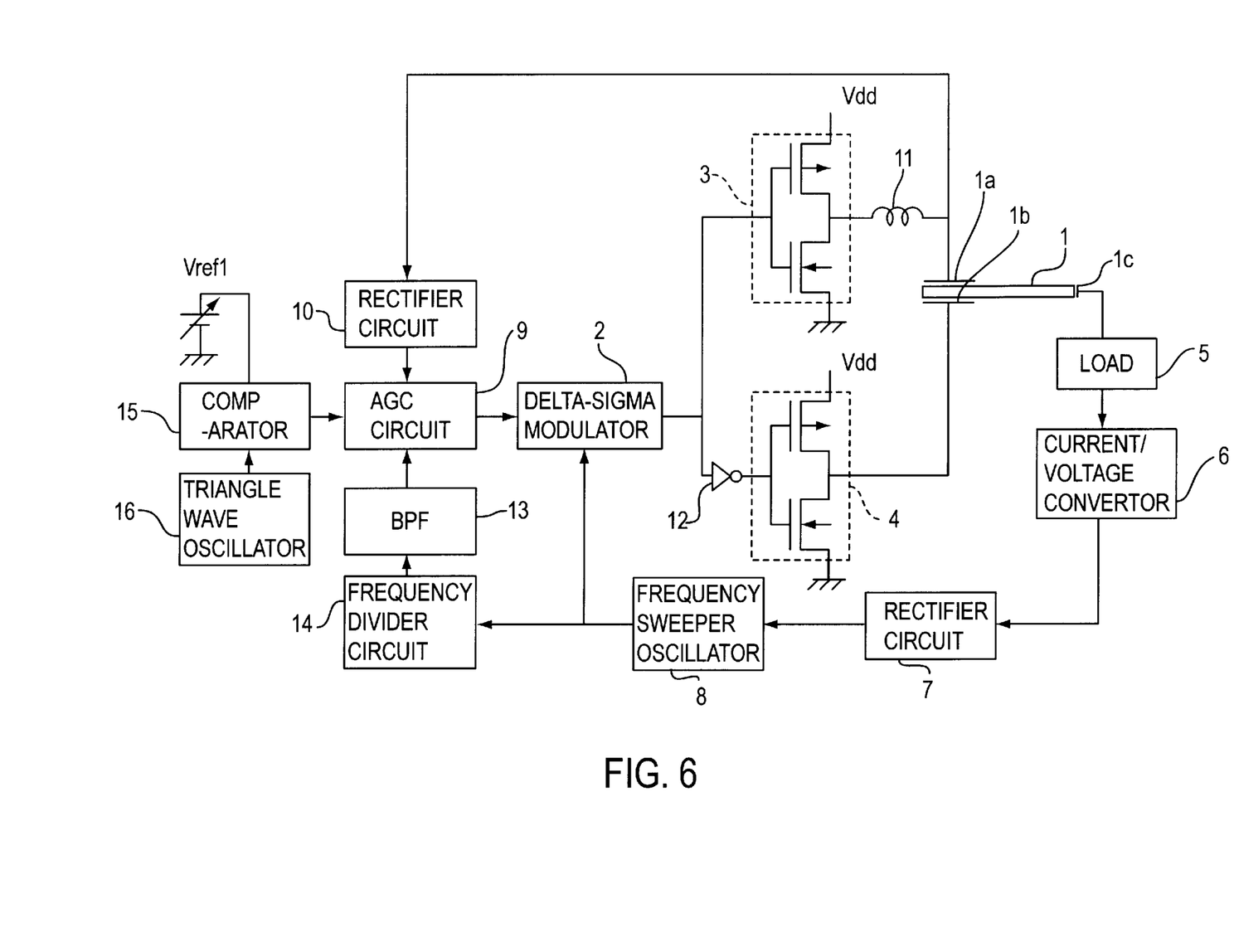
FIG. 6 is a block diagram of a second embodiment of an actuating circuit of a piezoelectric transformer according to the present invention.

Now, a second embodiment of the present invention is described with reference to FIG. 6. The second embodiment of FIG. 6 is a modified apparatus of the first embodiment of FIG. 5 of the present invention.

The second embodiment additionally includes variable reference voltage $V_{ref1}$, triangular wave oscillator 16 and comparator 15 which are a circuit for adjusting the value of current to flow to a load. The second embodiment performs similar basic operation to that of the first embodiment of FIG. 5.

Where load 5 actuated by piezoelectric transformer 1 is a cold cathode fluorescent lamp or a like device, if a conductive reflecting plate is located around the cold cathode fluorescent lamp, then ac current flowing through the cold cathode fluorescent lamp induces a floating capacitance with the reflecting plate. Thus, while the high voltage electrode side inputted from the piezoelectric transformer exhibits a high current value and a high brightness, the lower voltage electrode side exhibits a reduced current value because of current which flows through the floating capacitance intermediately of the cold cathode fluorescent lamp, resulting in a problem that the cold cathode fluorescent lamp exhibits a non-uniform brightness. This phenomenon appears more significantly as the actuating frequency increases and as the current value of the cold cathode fluorescent lamp decreases.

As a countermeasure to the problem, there is a method of controlling the brightness of a cold cathode fluorescent lamp by a name of PWM (Pulse Width Modulation) method to vary the ratio of time duration to supply a current to load 5 to time duration to supply no current. In the present embodiment, the PWM method is used as a method of varying the current value flowing to the load, and this circuit is described. Triangular wave oscillator 16 oscillates a triangular wave signal having a frequency sufficiently lower than the actuating frequency of piezoelectric transformer 1.

In the case where load 5 is a cold cathode fluorescent lamp, an oscillation frequency of several hundreds Hz which is sufficiently lower than the actuating frequency of piezoelectric transformer 1 and causes no dazzling for repeated lighting and extinction is used. Such output of the triangular wave is inputted to comparator 15 to be compared with variable reference voltage $V_{ref1}$ and the result of the comparison is outputted in a voltage of a binary value of a high level or a low level. With this variable reference voltage $V_{ref1}$, the duty ratio of a high level to a low level is determined in a frequency of triangular wave oscillator 16. This signal is inputted to AGC circuit 9, which is set such that, when this signal has a low level, a sine wave from AGC circuit 9 is stopped, but when the signal has a high level, a sine wave is outputted from AGC circuit 9. By varying reference voltage $V_{ref1}$ within the circuit constitution described above, the ratio of the time in which current flows to load 5 can be varied, and the brightness can be varied when applying for the cold cathode fluorescent lamp.

Figure 7:
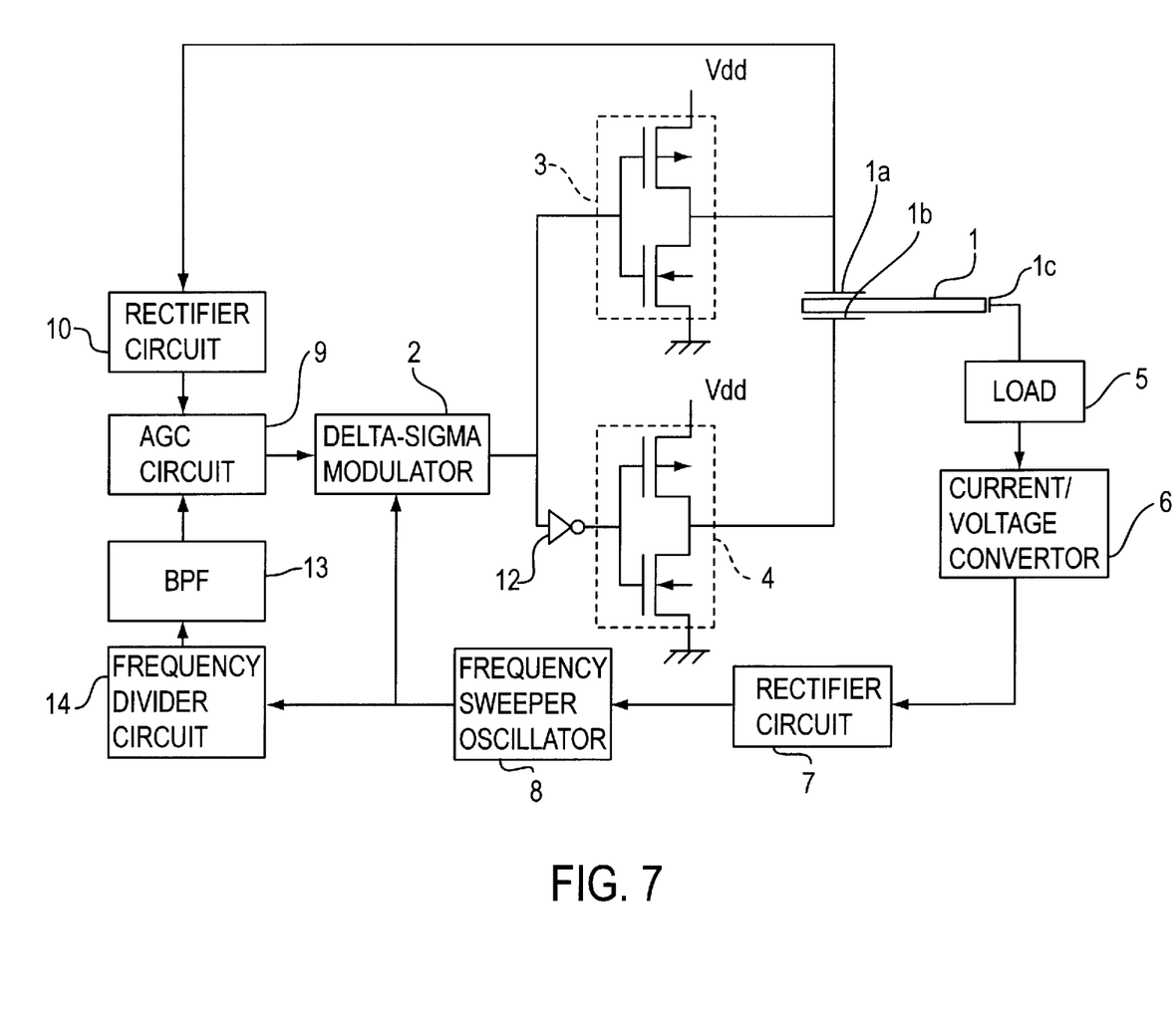
FIG. 7 is a block diagram of a third embodiment of an actuating circuit of a piezoelectric transformer according to the present invention.

Further, a third embodiment of the present invention is described with reference to FIG. 7. The third embodiment is a modification of the first embodiment of FIG. 5 except there is no coil 11 of FIG. 5, but performs basic operation similar to that of FIG. 5. The output of delta-sigma modulator 2 is input to output drivers 3 and 4, and the outputs of output drivers 3 and 4 are input directly to piezoelectric transformer 1. Therefore, the waveform input to piezoelectric transformer 1 is a pulse-like waveform shown in FIG. 9(B) having an amplitude between the GND potential and the power supply voltage, and the efficiency is deteriorated comparing with an alternative case wherein piezoelectric transformer 1 is actuated with a sine wave. However, the third embodiment is effective to a case wherein the physical size is small even if the efficiency is low, and since piezoelectric transformer 1 produces a reduced amount of a third harmonic or a fifth harmonic waves compared with the conventional example which employs a simple rectangular wave, parasitic oscillations of piezoelectric transformer 1 are not produced and piezoelectric transformer 1 can operate stably.

It is to be noted that, while the embodiments described above employ a first-order delta-sigma modulator, a second- or higher order delta-sigma modulator, a delta modulator or a MASH modulator may be employed.

Further, in the embodiments described above, as seen from FIGS. 5, 6 and 7, a piezoelectric transformer is actuated using two output drivers 3 and 4. Therefore, since twice the voltage is applied to piezoelectric transformer compared to a single output driver, a voltage equal to one half that of an ordinary voltage can be used as the power supply voltage as a result.

Therefore, when a piezoelectric transformer having a high boosting ratio such as a stacked piezoelectric transformer is used or there is no need for boosting a voltage to be input to a piezoelectric transformer, output driver 4 and invertor 12 may be omitted so that only output driver 3 is used as an output driver. Further, while, in the embodiment of the present invention shown in FIGS. 5, 6 or 7, an output driver is formed using a p-channel FET and an n-channel FET, bipolar transistors may be used instead.

According to the present invention, since a piezoelectric transformer is actuated with a sine wave, the piezoelectric transformer can be actuated efficiently without production of a loss by harmonic components.

Further, since the output driver is actuated with a 1-bit quantized bit signal, the output driver is required to only effect switching and loss is suppressed. Consequently, even if a sine wave is output equivalently, the loss by the actuating circuit can be reduced.

Furthermore, even if a plurality of electromagnetic transformers or coils are not used, since a sine wave can be generated using a single coil, an invertor which is small in physical size and thickness can be formed.

Further, according to the present invention, since the input voltage to the piezoelectric transformer is controlled so as to be fixed and a rectangular wave is inputted to the output drivers of the actuating circuit, even if the power supply voltage is high, the loss by the piezoelectric transformer and the piezoelectric transformer actuating circuit can be suppressed. Consequently, the range of use of the piezoelectric transformer is widened.

What is claimed is:

1. An actuating method of a piezoelectric transformer which outputs a voltage from secondary terminals, actuated by a voltage input to primary terminals, comprising the steps of:

generating an analog high frequency voltage;

converting said high frequency voltage to a digital signal;

converting said digital signal into a first high frequency voltage having a predetermined amplitude whose frequency is proximal to the resonance frequency of the piezoelectric transformer and an inverted high frequency voltage which has opposite phase to the first high frequency voltage having the same predetermined amplitude;

applying the first high frequency voltage to a primary electrode of the piezoelectric transformer;

extracting the output high frequency current from the secondary electrode of the piezoelectric transformer;

applying the first high frequency voltage to a primary electrode of the piezoelectric transformer;

extracting the output high frequency current from the secondary electrode of the piezoelectric transformer;

converting the extracted high frequency current into a high frequency voltage; and feeding back the high frequency voltage to the A/D converting step.

2. The actuating method of a piezoelectric transformer claimed in claim 1, wherein said digital signal is a 1-bit quantized bit signal obtained by oversampling the high frequency voltage.

3. The actuating method of a piezoelectric transformer as claimed in claim 2, wherein a voltage amplitude of the 1-bit quantized bit signal is used as a voltage of a dc power supply.

4. The actuating method of a piezoelectric transformer as claimed in claim 3, wherein, even if the dc voltage value varies, a voltage component of a first frequency included in the 1-bit quantized bit signal input to the primary terminals is fixed.

5. The actuating method of a piezoelectric transformer as claimed in claim 4, wherein the actuating signal to be inputted to the primary terminals is inputted through a band-pass filter which passes the first frequency.

6. The actuating method of a piezoelectric transformer as claimed in claim 4, wherein the actuating signal to be input to the primary terminals is input through a low-pass filter which passes the first frequency.

7. An actuating circuit of a piezoelectric transformer which outputs a voltage from a secondary terminal, actuated by a voltage input to primary terminals comprising:

a frequency sweeping oscillating circuit for generating a pulse signal of a second frequency higher than twice a first frequency which is the resonance frequency of the piezoelectric transformer;

a frequency divider circuit for dividing the pulse signal into the first frequency of said piezoelectric transformer;

a first band-pass filter for passing a sine wave of the first frequency of an output of said frequency divider circuit;

a delta-sigma modulator for converting the sine wave into a 1-bit quantized bit signal by oversampling the sine wave with the second frequency;

a first output driver for converting the output of the delta-sigma modulator to a first actuating high frequency voltage having amplitude of predetermined dc power to input into a first primary electrode of the piezoelectric transformer; and a second output driver for converting the output of the delta-sigma modulator to an opposite phase actuating high frequency voltage having the same amplitude but opposite phase to the first actuating high frequency voltage to input a second primary electrode of the piezoelectric transformer.

8. The actuating circuit of a piezoelectric transformer as claimed in claim 7, further including a second band-pass filter for passing the first frequency after having been converted into the high frequency voltage having the amplitude of the dc power supply.

9. The actuating circuit of a piezoelectric transformer as claimed in claim 7, further including a low-pass filter for passing the first frequency after having been converted into the first actuating high frequency voltage.

10. The actuating circuit of a piezoelectric transformer as claimed in claim 7, further including an actuating voltage control circuit for controlling a voltage component of the first frequency of the actuating voltage to a fixed level.

11. The actuating circuit of a piezoelectric transformer as claimed in claim 8, further including an actuating voltage control circuit for controlling to fix a voltage component of the first frequency of the actuating voltage.

12. The actuating circuit of a piezoelectric transformer as claimed in claim 9, further including an actuating voltage control circuit for controlling to fix a voltage component of the first frequency.

* * * * *